United States Patent [19]

Matthews

[11] Patent Number: 5,647,954
[45] Date of Patent: Jul. 15, 1997

[54] MANUFACTURE OF ETCHED SUBSTRATES SUCH AS INFRARED DETECTORS

[75] Inventor: Brian Edward Matthews, Hampshire, United Kingdom

[73] Assignee: GEC Marconi Limited, Middlesex, England

[21] Appl. No.: 290,891

[22] PCT Filed: Feb. 25, 1993

[86] PCT No.: PCT/GB93/00393

§ 371 Date: Oct. 20, 1994

§ 102(e) Date: Oct. 20, 1994

[87] PCT Pub. No.: WO93/17454

PCT Pub. Date: Sep. 2, 1993

[30] Foreign Application Priority Data

Feb. 26, 1992 [GB] United Kingdom ............... 9204078

[51] Int. Cl.⁶ ............................................. H01L 21/00
[52] U.S. Cl. .................. 156/644.1; 156/659.11; 156/662.11; 216/41; 216/83
[58] Field of Search ................. 156/662.1, 659.11, 156/625.1, 644.1; 216/41, 49, 83, 39, 96

[56] References Cited

U.S. PATENT DOCUMENTS

| | | | |
|---|---|---|---|
| 3,817,799 | 6/1974 | Schutze et al. | 156/662.1 X |
| 4,128,467 | 12/1978 | Fischer | 204/192.34 |
| 4,521,798 | 6/1985 | Baker | 257/442 |
| 4,720,738 | 1/1988 | Simmons | 357/30 |
| 4,867,842 | 9/1989 | Bohrer et al. | 156/662.1 X |

FOREIGN PATENT DOCUMENTS

| | | |
|---|---|---|
| 475525 | 3/1992 | European Pat. Off. . |
| 481552 | 4/1992 | European Pat. Off. . |
| 1212379 | 11/1970 | United Kingdom . |
| 1559473 | 1/1980 | United Kingdom . |
| 2027985 | 2/1980 | United Kingdom . |
| 2027986 | 2/1980 | United Kingdom . |
| 2095898 | 10/1982 | United Kingdom . |
| 2095899 | 10/1982 | United Kingdom . |
| 2095900 | 10/1982 | United Kingdom . |
| 2095905 | 10/1982 | United Kingdom . |
| 2201834 | 9/1988 | United Kingdom . |
| 2207802 | 2/1989 | United Kingdom . |
| 2234854 | 2/1991 | United Kingdom . |
| A1 91/02270 | 2/1991 | WIPO . |
| WO91/03074 | 3/1991 | WIPO . |

OTHER PUBLICATIONS

"Thin Film Prozess", by J.L. Vossen and W. Kern, Chemical Etching, Part III-B: Semiconductors, pp. 401, 427, 430-432, tables XII,XIII, Academic Press, 1978.

*Primary Examiner*—Thi Dang
*Attorney, Agent, or Firm*—Donald C. Casey

[57] ABSTRACT

A narrow and deep aperture is chemically etched in or through a body of, for example, cadmium mercury telluride or other infrared sensitive material. The etchant is constrained and etches faster adjacent to side walls of a mask on the body. Those side walls are sufficiently close to each other than the faster etching areas overlap. Apertures or slots having a width of about 7 um may be etched in this manner through a thickness of about 5 um via windows having a width of about 3 um in a photo resist of a thickness between 4 and 5 um.

14 Claims, 2 Drawing Sheets

MANUFACTURE OF ETCHED SUBSTRATES SUCH AS INFRARED DETECTORS

BACKGROUND OF THE INVENTION

1. Field of the Invention

This invention relates to methods of etch manufacturing elements such as infrared detector elements, in which at least one narrow aperture is etched in a substrate or body. The body may comprise an infrared-sensitive material, particularly but not exclusively, cadmium mercury telluride. However, it is also recognised by the applicants that such an etching process may be applied to other electronic devices, for example those comprising other semiconductor materials.

2. Description of the Prior Art

For many years it has been known to use buffered chemical (isotropic) etchants in the manufacture of electronic devices, including semiconductor devices and infrared detectors. Published United Kingdom patent specification GB-A-1 559 473 describes the manufacture of infrared detector elements of cadmium mercury telluride in which separate body portions are formed for each element by etching slot-shaped apertures through cadmium mercury telluride bodies mounted on a temporary support. On the bodies, an etchant resistant mask of photoresist is provided having windows where the slots are to be etched. In a particular embodiment, the width of the slots is 30 um (micrometers) as finally etched through bodies which themselves have a thickness of 8 um. It is noted that, even if the thickness of the bodies is reduced to 6 um, it is not readily possible to achieve a separation of less than 12 um using such an etchant treatment. For this reason, the separate detector elements defined by this etching treatment in the embodiment of GB-A-1 559 473 are formed on a temporary support from which they are subsequently removed and assembled, with a closer separation, on a substrate of the detector device.

SUMMARY OF THE INVENTION

The present invention is based on a recognition that, by using non-buffered etchants and by constraining the etchant flow in the window, narrow and deep apertures can be formed. Thus, the present invention employs a type of preferential (non-isotropic) etching whereby the etchant in a mask window etches at a faster rate adjacent to the side-walls of the mask.

According to the present invention, there is provided a method of etching a substrate to form a narrow trough of predetermined width therein, the method comprising the steps of masking said substrate with an etch resistant mask having a thickness, said mask including an aperture in register with a location whereat the trough is to be formed, said mask aperture being defined by facing side-walls of height equal to said mask thickness, etching said substrate through said aperture with a non-isotropic etchant providing, adjacent said side-walls, areas of faster etching, and further including the step of forming said mask aperture with said side-walls so spaced that said areas overlap.

The present invention also provides a method of manufacturing an infrared detector having at least one aperture etched in a body comprising infrared-sensitive material, which method includes the steps of (a) providing, on the body, an etchant resistant mask having a window where the aperture is to be etched, the mask having facing side=walls at the window, and (b) subjecting the infrared-sensitive material of the body, via the window, to an etchant which etches at a faster rate adjacent to the side-walls of the mask, wherein the facing side-walls are sufficiently close to each other that the flow of the etchant within the window is constrained by these side-walls of the mask and that the areas of faster etching at the facing side-walls overlap within the window to form a narrow and deep aperture in the body adjacent to the window.

It should be noted that, as described in published International (PCT) patent application WO 91/02270, known chemical etchants when not buffered typically exhibit a property known as preferential etching whereby the etch rates are faster at the side-walls of the etchant resistant mask than in areas further away from these side-walls. This preferential etching was considered an undesirable property, as workers in the art had considered it desirable to each away the material at the window uniformly over the entire area of the window. For this reason most chemical etchants used in electronic device manufacture have been buffered in order to reduce preferential (non-isotropic) etching characteristics. The invention proposed in WO 91/02270 takes advantage of this preferential etching property in order to shape the etched surface into an array of small lenses in an optical lens plate of an infrared detector array. For this purpose WO 91/02270 discloses the use of an etchant mask in the form of a mask grid having a width of between 7.5 um and 10 um between 90 um wide windows, and the etching is continued until the mask floats away. By contrast therewith the present invention relates to an opposite situation with a narrow window in a wide mask, the window being so narrow that the areas of faster etching (at the side-walls) are not separate but overlap within the window.

The etchant flow within the window is preferably constrained by the closely-spaced facing side-walls of the mask at the window. In order to enhance the constraint on etchant flow, preferably, a set-up is used in which (a) at the window, the mask has a thickness larger than the close spacing of the facing side-walls, and/or (b) the flow of the preferential etchant to and from the window of the mask is constrained by the body being mounted on the underside of a support over a pad on which the etchant is present. The support may have a spacer on its underside to determine the thickness of a narrow etchant-filled gap between the pad and the body.

In order to obtain good overlap of the faster etching areas at the facing side-walls of the mask, the width of the window between these side-walls is preferably less than 5 um, for example about 3 um.

The etching may be terminated when the apertures formed are shallower than the thickness of the body i.e. troughs formed. However, the process is particularly useful for etching narrow apertures through the thickness of bodies of, for example, cadmium mercury telluride. Slots and other apertures may be etched in accordance with the invention to have a width which is less than twice the thickness of the body through which they extend. Thus, for example, slots having a width of about 7 um may be etched in this manner through cadmium mercury telluride having a thickness of 5 um. It should be noted that, until now, infrared detector manufactures have resorted to the use of ion milling to form such narrow deep slots though cadmium mercury telluride (see for example U.S. Pat. No. 4,128,467). However, ion milling of cadmium mercury telluride produces a high n type conductivity at the milled surface which can be undesirable (see for example published United Kingdom patent application GB-A-2 234 854). The etching process in accordance with the present invention does not produce this effect. It can therefore be used to advantage when etching narrow aper-

3 tures in both n type and p type cadmium mercury telluride, so permitting the obtainment of various infrared detector structures with better characteristics.

BRIEF DESCRIPTION OF THE DRAWINGS

These and other features in accordance with the invention are illustrated specifically in embodiments of the invention now to be described, by way of example, with reference to the accompanying diagrammatic drawings, in which.

DESCRIPTION OF THE PREFERRED EMBODIMENTS

Figure 1:
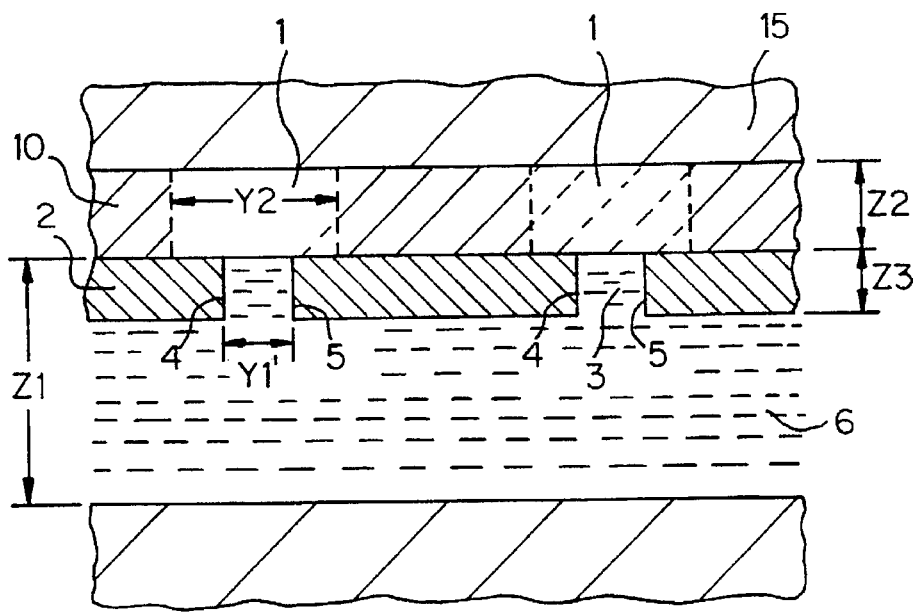
FIG. 1 is a schematic cross-sectional view of an etching arrangement for a body of infrared-sensitive material at a stage in the manufacture of an infrared detector using a method in accordance with the invention.
Figure 2:
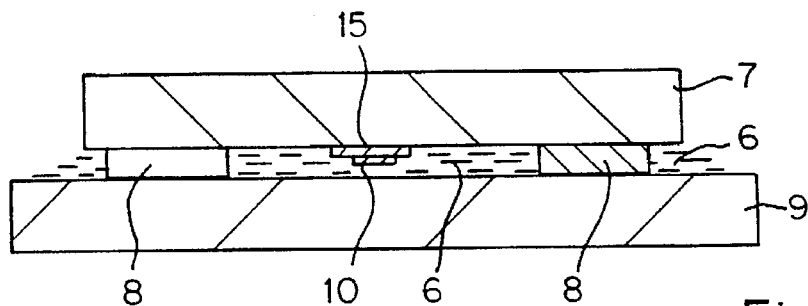
FIG. 2 is a cross-sectional view of parts of the etching equipment which may be used for the etching stage of FIG. 1, and FIGS. 3 and 4 are plan views of two examples of different infrared detectors manufactured in accordance with the invention, with slots etched in accordance with FIG. 1.

It should be noted that all the Figures are diagrammatic, the relative dimensions and proportions of parts of the various embodiments having been shown exaggerated or reduced in size for the sake of clarity and convenience in the drawings. In general the same reference signs are used to denote corresponding or similar parts in the different embodiments.

FIG. 1 illustrates an etching stage in the manufacture of an infrared detector in which at least one aperture 1 of width Y2 is etched in a body 10 of infrared-sensitive material, for example cadmium mercury telluride. The body 10 is assumed to have appropriate crystalline axial orientation. An insulating and passivating layer (not shown) of for example an anodic oxide and/or zinc sulphide may be present on the surface of the body 10. An etchant resistant mask 2 of, for example, photoresist, is provided on the body 10 and has a window 3 of width Y2 where the (or each) aperture 1 is to be etched. The mask 2 has facing side-walls 4 and 5 at the window 3. In its plan view, the window 3 may be of any desired geometry (for example square, circular or elongate) as appropriate to the geometry of the aperture 1 to be etched.

Via the window 3, the infrared-sensitive material of the body 10 is subjected in accordance with the invention to a non-isotropic chemical etchant 6 which etches at a faster rate adjacent to the side walls 4 and 5 of the mask 2 than the etching rate of that etchant 2 on the same body material but at an exposed area remote from any of the side-walls of the mask 2. Also in accordance with the invention, the facing side-walls 4 and 5 are sufficiently close to each other that the flow of the etchant 6 within the window 3 is constrained by these side-walls 4 and 5 of the mask 2 to such an extent that the areas of faster etching at these facing side-walls 4 and 5 overlap within the window 3 whereby a narrow and deep aperture 1 is formed in the body 10 adjacent to the window 3.

In a specific example of a body 10 of cadmium mercury telluride of a decomposition having a wavelength response in the 3 to 14 um range, a freshly-made solution of 1.6 ml of bromine in 80 ml of an alcohol such as ethylene glycol may be used as the etchant 6. This unbuffered etchant solution has strong etchant properties on cadmium mercury telluride, and exhibits its fastest etching rate adjacent to the side-wall of a mask window so that the cadmium mercury telluride adjacent the side walls 4 and 5 of FIG. 1 is etched away most rapidly. The reason for this preferential etching adjacent to a side-wall of the etchant mask is not entirely understood. The high attack rate achievable using a strong etchant seems to be one important factor, but the applicants also believe that the pattern of etchant flow within the mask window is important in that a vortex may occur adjacent to the side-wall due to the side-wall of the mask acting as a barrier constraining the etchant flow. The etchant flow affects the supply of fresh etchant reagent to the surface being etched and the removal of waste products from the reaction zone.

In order further to constrain and control the etchant flow, the thickness Z3 of the mask 2 at the window 3 is made larger than the close spacing Y1 of the facing side-walls 4 and 5 of the window 3. Preferably the flow of the etchant 6 to and from the window 3 is constrained by the body 10 being mounted on the underside of a support 7 over a pad 9 on which the etchant 6 is present. The support 7 has spacers 8 on its underside to determine the thickness Z1 of a narrow gap filled with etchant 6 between the body 10 and the pad 9. Movement of the support 7 over the pad 9 during the etching process controls the flow of fresh etchant and waste products into and out of the narrow window 3 and so also affects the flow within the window 3. Vortex effects are thought to occur at the side-walls 4 and 5; because those facing side-walls are so close to each other that the areas of preferential etching overlap, the aperture 1 is etched deeply at a fast rate over the whole width Y1 of the window 3.

In the specific example with bromine in glycol and a cadmium mercury telluride body 10, slots 1 having a width Y2 of 7 um were etched to a depth Z2 of 5 um through elongate windows 3 having a width Y1 of 3 um in a photoresist mask 2 having a thickness Z3 of between 4 and 5 um. The gap Z1 was 200 um. In this manner slots 1 were etched through the 5 um thickness of a cadmium mercury telluride body 10 on a substrate 15 of the detector being manufactured.

Figure 3:
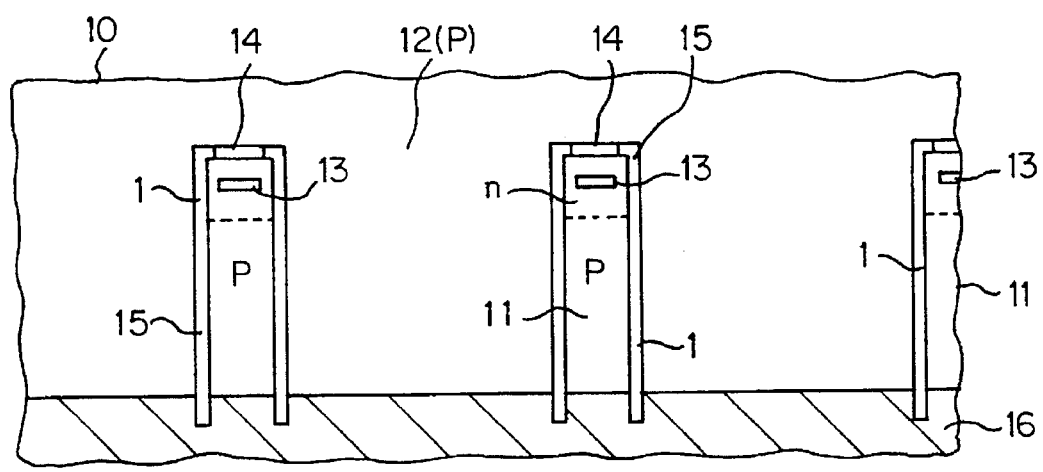
Figure 4:
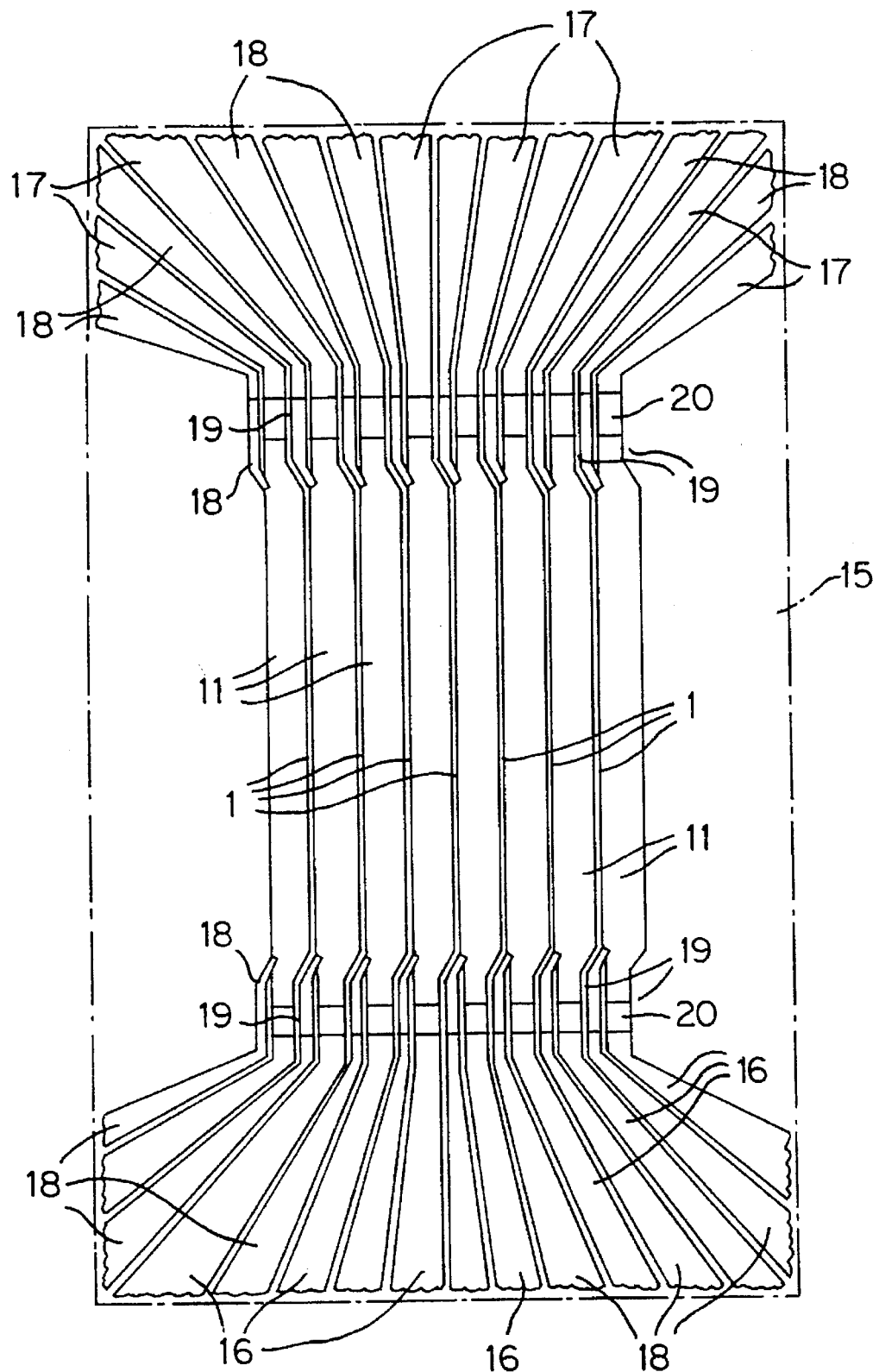

FIGS. 3 and 4 illustrate two slot arrangements which can be formed advantageously by such an etching treatment, in accordance with the present invention, in the manufacture of two different types of cadmium mercury telluride infrared detectors in accordance with the present invention.

FIG. 3 corresponds to FIG. 5 of published EP-A-0525876 (corresponding to U.S. Pat. No. 5,306,915) and whole contents of which specification are hereby incorporated herein as reference material. This specification discloses the construction of an infrared detector array comprising detector elements 11 of cadmium mercury telluride (or another infrared sensitive semiconductor material) sandwiched between a substrate 15 and a lens plate (or other optical element). The sandwiched cadmium mercury telluride layer comprises a slotted structure 11, 1, 12 in order to avoid a change in the detector-element characteristics due to stress induced in the element bodies 11 by an adhesive layer used to secure the lens plate over the detector elements 11. In this slotted structure, which is shown in FIG. 3 of the present drawings, each element body 11 is part of a wider-layer cadmium mercury telluride body 10 which occupies a majority of the volume around the element body 11 between the substrate 15 and the lens plate. Slots 1, etched in accordance with the present invention, separate each element body 11 around at least a majority of its periphery from the neighbouring remainder 12 of the body 10. In the form shown in FIG. 3, the remainder 12 and most of each element body 11 is of p type material. The detector elements 11 are p-n photodiodes having an n type region formed by ion milling an aperture 13 through each element body 11 to the substrate 15. The aperture 13 is metallised to form an individual electrical connection, for each photodiode, to a conductor pattern 14 on the substrate 15. A conductor pattern 16 on the opposite end of the element bodies 11 provides the second connection of the photodiodes. Chemical etching, in accordance with the present invention, provides narrow slots 1 between the neighbouring portions 11 and 12 without converting the conductivity type of the p type material as would occur if the slots 1 were ion milled instead.

FIG. 4 corresponds to FIG. 1 of published United Kingdom patent application GB-A-2 095 899 (corresponding to U.S. Pat. No. 4,467,201) the whole contents of which are hereby incorporated herein as reference material. This specification discloses the construction of an infrared imaging device comprising a plurality of elongate photoconductive detector elements 11 on a substrate 15. Each detector element comprises an n type strip of cadmium mercury telluride which is separated from neighbouring strips 11 by slots 1, chemically etched in accordance with the present invention. These slots 1 divide the whole cadmium mercury telluride body 10 on the substrate 15 into the separate parallel strips 11. On each detector element strip 11, there are then provided metal electrodes 16 to 18 in a pattern which extends over the ends of the strips 11 and onto the substrate 15. The electrodes comprise spaced bias electrodes 16 and 17 between which a bias current predominantly of electrons flows along each strip 11. The bias current supports an ambipolardrift of infrared-generated charge carriers in the opposite direction.

These charge carriers are detected in a read-out area 20 by means of a read-out connection 18 protruding from one side of each strip 11. The geometry of the slots 1, etched in accordance with the present invention, is such that each strip 11 has a recess 19 at one side of the read-out area into which the read-out connection 18 of the neighbouring strip 11 extends so as to narrow the read-out area 20 of each detector element and allow close packing of the detector elements 11 on the substrate 15. Chemical etching in accordance with the present invention provides narrow slots 1 between the neighbouring strips 11 without increasing the n type conductivity along the side-walls of the strips 11. Such an increased n type conductivity (as could occur if the slots 1 had been ion milled instead of chemically etched) would increase the bias-current power dissipation along the element 11 which is undesirable in this type of detector.

It will be evident that chemically etching narrow and deep slots and other-shaped apertures 1 at a fast rate in infra-red sensitive material via narrow windows under the conditions of the present invention can be used in the manufacture of other infrared detector structures and that in the manufacture of these other structures, as well as those of FIGS. 3 and 4, many known variations and modifications can be employed. By way of example various detector structures and manufacturing process steps are disclosed in published patent applications listed below with their U.S. patent counterparts as follows:

TABLE

| Foreign Patent | Corresponding U.S. Pat. No. |
|---|---|
| GB-A-2027986 | 4,321,615 |
| GB-A-2201834 | 4,801,802 |
| GB-A-2095905 | 4,521,798/4,559,695 |
| GB-A-2116363 | 4,555,720/4,625,389 |
| EP-A-0475525 | 5,185,648 |

TABLE-continued

| Foreign Patent | Corresponding U.S. Pat. No. |
|---|---|
| GB-A-2027985 | 4,321,615 |
| GB-A-2095898 | 4,411,732 |
| GB-A-2095900 | 4,482,807 |
| GB-A-2027802 | 4,859,851 |
| EP-A-0481552 | 5,239,179 | the whole contents of which specifications are hereby incorporated herein as reference material. It will also be evident that such chemical etching treatments for forming narrow and deep apertures in accordance with the present invention may be employed in the manufacture of other electronic devices, and not merely infrared detectors.

Thus, other variations and modifications apparent to persons skilled in the art may involve equivalents and other features which are already known in the design, manufacture and use of infrared detectors and other electronic devices and component parts thereof, and which may be used instead of or in addition to features already described herein. Although claims have been formulated in this application to particular combinations of features, it should be understood that the scope of the disclosure of the present application also includes any novel feature or any novel combination of features disclosed herein either explicitly or implicitly or any generalisation thereof, whether or not it relates to the same invention as presently claimed in any claim and whether or not it mitigates any or all of the same technical problems as does the present invention. The applicants hereby give notice that new claims may be formulated to such features and/or combinations of such features during the prosecution of the present application or of any further application derived therefrom.

I claim:

1. A method of etching a substrate to form a narrow trough of predetermined width therein, the method comprising the steps of masking said substrate with a etch resistant having a thickness, said mask including an aperture in register with a location whereat the trough is to be formed, said mask aperture being defined by facing side-walls of height equal to said mask thickness, etching said substrate through said aperture with a non-isotropic liquid etchant providing, adjacent said side-walls, areas of faster etching, and further including the step of forming said mask aperture with said side-walls so spaced that said areas overlap and controlling the thickness of said mask so that said side-walls are of a height sufficient to constrain flow of etchant to ensure said areas of faster etching overlap, and greater than the side-wall spacing.

2. A method according to claim 1 including the step of further constraining the flow of etchant with a pad, said substrate and mask being supported in an inverted manner over said pad and being spaced therefrom by spacers, said etchant being provided on said pad between said spacers.

3. A method according to claim 1 wherein the substrate is a semiconductor.

4. A method according to claim 3 wherein the semiconductor is an infrared sensitive material.

5. A method according to claim 4 wherein the infrared sensitive material is Cadmium Mercury Telluride.

6. A method according to claim 1 wherein the etchant is a strong solution of bromine in an alcohol.

7. A method according to claim 6 wherein the alcohol is ethylene glycol.

8. A method according to claim 1 wherein the trough is etched to a depth equal to the thickness of the substrate.

9. A method of manufacturing an infrared detector having at least one aperture etched in a body comprising infrared-sensitive material, which method includes the steps of (a) providing on the body an etchant resistant mask having a window where the aperture is to be etched, the mask having facing side-walls at the window, and (b) subjecting the infrared-sensitive material of the body via the window to a liquid etchant which etches at a faster rate adjacent to the side-walls of the mask, wherein the facing side-walls are sufficiently close to each other that the flow of the etchant within the window is constrained by these facing side-walls of the mask and that the areas of faster etching at the facing side-walls overlap within the window to form a narrow and deep aperture in the body adjacent to the window, at said window, said mask having a thickness larger than the close spacing of the facing side-walls.

10. A method as claimed in claim 9 wherein the flow of the etchant to and from the window of the mask is constrained by the body being mounted on the underside of a support over a pad on which the etchant is present, the support having a spacer on its underside to determine the thickness of a narrow etchant-filled gap between the pad and the body.

11. A method as claimed in claim 9, wherein the infrared-sensitive material is cadmium mercury telluride, the body of which is present on a substrate of the detector, and the aperture is etched through the thickness of the body to the substrate.

12. A method as claimed in claim 11, wherein the etchant comprises a fresh strong solution of bromine in ethylene glycol.

13. A method as claimed in claim 11, wherein the window is of elongate geometry, and the aperture formed by the etching via this window is a slot which separates two neighbouring portions of the body.

14. A method as claimed in claim 9, wherein the aperture produced by the etching step (b) has a width which is less than twice its depth.

* * * * *

UNITED STATES PATENT AND TRADEMARK OFFICE
CERTIFICATE OF CORRECTION

PATENT NO. : 5,647,954
DATED : July 15, 1997
INVENTOR(S) : Brian MATTHEWS

It is certified that error appears in the above-indentified patent and that said Letters Patent is hereby corrected as shown below:

At column 6, on line 38, after "resistant" the following should be inserted --mask--.

Signed and Sealed this

Twenty-seventh Day of January, 1998

*Attest:*

BRUCE LEHMAN

*Attesting Officer*        *Commissioner of Patents and Trademarks*